(12) United States Patent
Taniyama et al.

(10) Patent No.: US 11,610,797 B2
(45) Date of Patent: Mar. 21, 2023

(54) WAFER STOCKER

(71) Applicant: Sinfonia Technology Co., Ltd., Tokyo (JP)

(72) Inventors: Yasushi Taniyama, Tokyo (JP); Toshihiro Kawai, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 17/297,509

(22) PCT Filed: Nov. 25, 2019

(86) PCT No.: PCT/JP2019/046033
§ 371 (c)(1),
(2) Date: May 27, 2021

(87) PCT Pub. No.: WO2020/111013
PCT Pub. Date: Jun. 4, 2020

(65) Prior Publication Data
US 2022/0037184 A1 Feb. 3, 2022

(30) Foreign Application Priority Data

Nov. 28, 2018 (JP) .............................. JP2018-222883

(51) Int. Cl.
*H01L 21/677* (2006.01)
*B65G 1/04* (2006.01)
(Continued)

(52) U.S. Cl.
CPC ...... *H01L 21/67778* (2013.01); *B65G 1/0485* (2013.01); *F24F 13/06* (2013.01);
(Continued)

(58) Field of Classification Search
CPC ......... H01L 21/67778; H01L 21/67766; H01L 21/67769
See application file for complete search history.

(56) References Cited

U.S. PATENT DOCUMENTS

2002/0182040 A1* 12/2002 Kimura ............. H01L 21/67772
414/940
2006/0216137 A1* 9/2006 Sakata .............. H01L 21/67766
414/222.13
(Continued)

FOREIGN PATENT DOCUMENTS

| JP | 2000124301 A | 4/2000 |
| JP | 2006256794 A | 9/2006 |

(Continued)

OTHER PUBLICATIONS

International Patent Application No. PCT/JP2019/046033, Search Report (and English translation) and Written Opinion, dated Dec. 24, 2019.

*Primary Examiner* — Gerald McClain
(74) *Attorney, Agent, or Firm* — Kilpatrick Townsend & Stockton LLP

(57) ABSTRACT

A wafer stocker is capable of further improving an environment around wafers. The wafer stocker includes a housing, a loading device provided on a front surface of the housing, a wafer cassette shelf arranged in the housing, a wafer transfer robot configured to move the wafers from a transfer container mounted on the loading device to a wafer cassette in the wafer cassette shelf, a wafer cassette delivery device configured to move the wafer cassette in the wafer cassette shelf to a stage having a different height, and a fan filter unit configured to generate a laminar flow in a wafer transfer space and in a wafer cassette transfer space.

8 Claims, 12 Drawing Sheets

(51) Int. Cl.
 *F24F 13/06* (2006.01)
 *H01L 21/687* (2006.01)
 *B25J 11/00* (2006.01)

(52) U.S. Cl.
 CPC .. *H01L 21/67766* (2013.01); *H01L 21/67769* (2013.01); *H01L 21/68707* (2013.01); *B25J 11/0095* (2013.01); *B65G 2201/0297* (2013.01)

(56) References Cited

U.S. PATENT DOCUMENTS

| | | | |
|---|---|---|---|
| 2007/0295274 A1 | 12/2007 | Webb et al. | |
| 2015/0170945 A1* | 6/2015 | Segawa | H01L 21/67115 414/217 |
| 2020/0227295 A1 | 7/2020 | Murata et al. | |
| 2021/0028031 A1* | 1/2021 | Kawai | H01L 21/67772 |

FOREIGN PATENT DOCUMENTS

| | | | | |
|---|---|---|---|---|
| JP | 2008068963 A | * | 3/2008 | ............... B65G 1/02 |
| JP | 2009541599 A | | 11/2009 | |
| JP | 2011241020 A | | 12/2011 | |
| WO | 2017038269 A1 | | 3/2017 | |

* cited by examiner

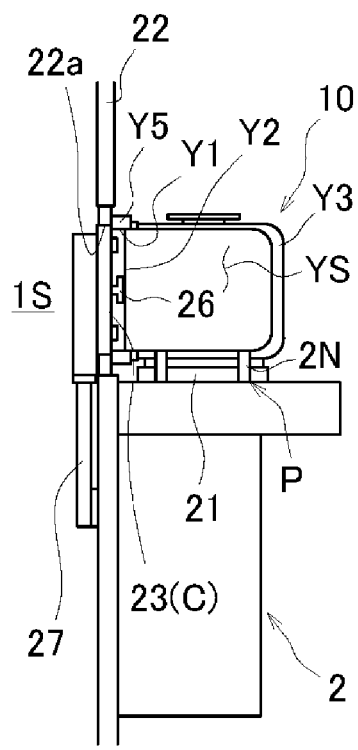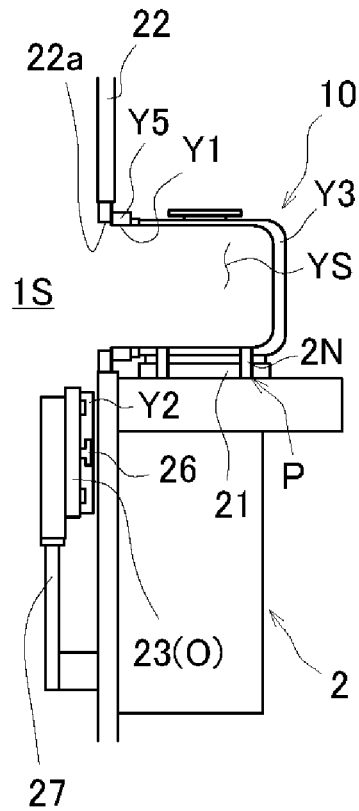

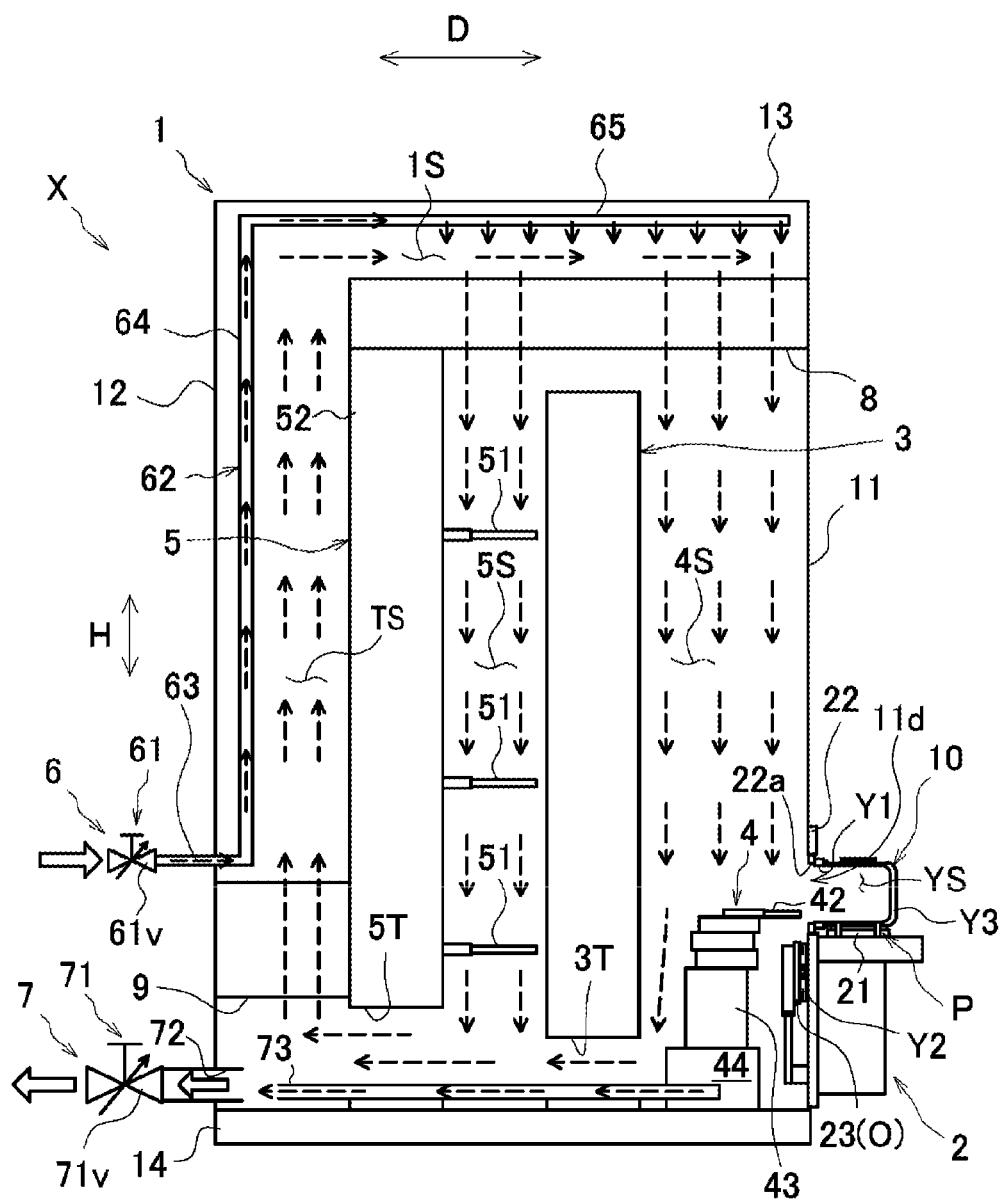

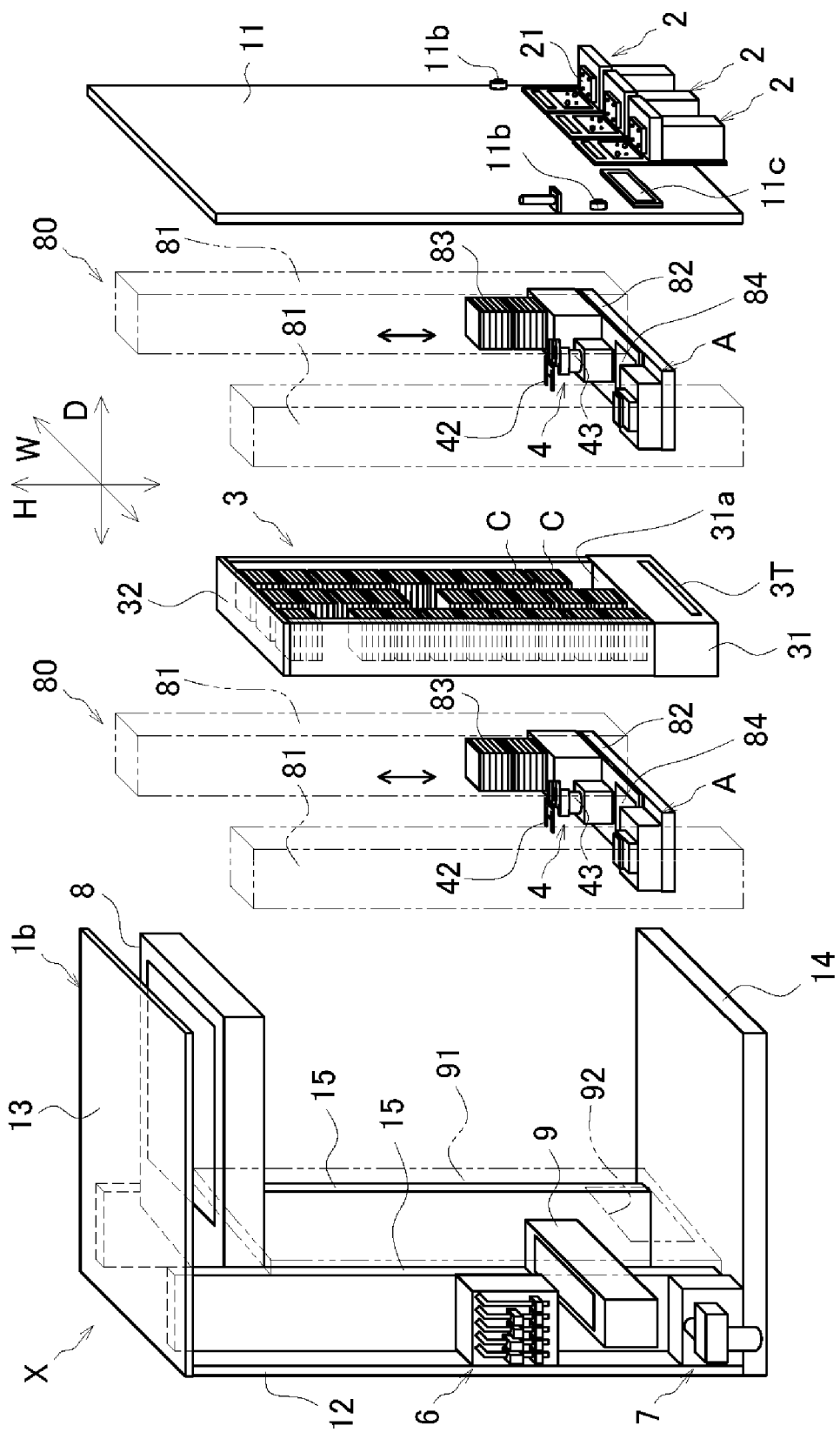

WAFER STOCKER

CROSS-REFERENCE TO RELATED APPLICATIONS

This application is a national stage application of International Patent Application PCT/JP2019/046033, filed on Nov. 25, 2019, which claims priority to Japan Patent Application No. 2018-222883, filed on Nov. 23, 2018, both of which are hereby incorporated by reference in their entireties.

TECHNICAL FIELD

The present disclosure relates to a wafer stocker for temporary storage of wafers.

BACKGROUND

In a semiconductor device manufacturing process, wafers are processed in a clean room to improve the yield and quality. In order to properly maintain the atmosphere around the wafers, a storage pod (transfer container) called a FOUP (Front-Opening Unified Pod) is used. A FOUP stocker that temporarily stores such a FOUP in a clean room has been known in the related art (see, e.g., Patent Document 1).

The FOUP stocker includes a plurality of shelves arranged in multiple stages in a height direction, and is configured so that FOUPs accommodating unprocessed wafers therein and FOUPs accommodating processed wafers therein can be placed on the shelves. In other words, the FOUP stocker is configured to place and store the entire FOUP (the entire FOUP accommodating the wafers) on the shelves in the FOUP stocker.

PRIOR ART DOCUMENT

Patent Document

Patent Document 1: Japanese National Publication of International Patent Application No. 2009-541599

As semiconductor devices are further miniaturized, it may be required to further improve the atmosphere around wafers even in the internal space of a stocker. Since a small amount of dust is present even in a clean room, the dust may adhere to the surface of a FOUP. Further, since the FOUP is generally made of a water-absorbent resin material, moisture in the atmosphere in the clean room may be introduced into the FOUP. If such a FOUP is brought into the FOUP stocker described in Patent Document 1, it may be difficult to maintain a good atmosphere in the FOUP stocker due to the dust or moisture released from the FOUP. Therefore, in the configuration in which the entire FOUP is stored in the stocker as described in Patent Document 1, the improvement of the atmosphere around the wafers may be hindered even if the stocker is filled with, for example, nitrogen or dry air.

The present disclosure provides embodiments of a wafer stocker capable of improving an atmosphere around wafers.

SUMMARY

According to one embodiment of the present disclosure, a wafer stocker includes: a housing; a loading device installed on a front surface of the housing and configured to mount a transfer container capable of accommodating a plurality of wafers; a wafer cassette shelf arranged in the housing and configured to store a plurality of wafer cassettes in a multi-stage manner, the wafer cassettes configured to store the plurality of wafers in a multi-stage manner; a wafer transfer robot configured to load and unload the wafers between the transfer container mounted on the loading device and the wafer cassettes stored in the wafer cassette shelf; a wafer cassette delivery device configured to move the wafer cassettes stored in a predetermined stage among a plurality of stages of the wafer cassette shelf to a stage having at least a height different from the predetermined stage; and a fan filter unit configured to generate a laminar flow in a wafer transfer space of the housing in which the wafer transfer robot is arranged and in a wafer cassette transfer space of the housing in which the wafer cassette delivery device is arranged.

The wafer stocker according to the present disclosure has a configuration in which the wafers are stored in units of the wafer cassette capable of accommodating the wafers in multiple stages. Therefore, as compared with the stocker in the related art that accommodates an entire transfer container such as a FOUP or the like, it is possible to prevent or suppress a situation in which the dust adhering to the outer surface of the transfer container enters the housing and scatters or accumulates in the housing.

In addition, the wafer stocker according to the present invention has a configuration in which the wafers are stored generally through the use of the wafer cassette smaller than the transfer container. Therefore, as compared with the stocker in the related art that accommodates the transfer container, it is possible to downsize the entire stocker, increase the number of wafers to be stored, and narrow the footprint. Further, since the wafer stocker according to the present disclosure has a configuration in which the wafer cassette is delivered in the housing, when the wafers are moved to different stages, it is possible to improve the transfer efficiency as compared with the case where the wafers are moved one by one.

Further, in the wafer stocker according to the present disclosure, the laminar flow is generated by the fan filter unit in the wafer transfer space and the wafer cassette transfer space. Therefore, it is possible to suppress the scattering of the dust generated during the operation of the wafer transfer robot or the operation of the wafer cassette delivery device.

Further, in the wafer stocker according to the present disclosure, the wafer transfer robot may be configured to deliver the wafers between the transfer container mounted on the loading device and the wafer cassette arranged in a stage of a height facing the transfer container in a front-rear direction among the plurality of stages of the wafer cassette shelf.

By doing so, it is possible to minimize the time required for delivering the wafers between the transfer container and the wafer cassette, and to shorten the takt time.

Further, in the wafer stocker according to the present disclosure, a circulation path for circulating a gas that includes the wafer transfer space and the wafer cassette transfer space may be formed in the housing.

By doing so, for example, as compared with a configuration in which the gas is supplied into the housing and entirely discharged from the housing, it is possible to reduce the amount of gas supplied, and to reduce the running cost.

According to the present disclosure, it is possible to provide a wafer stocker capable of improving an atmosphere around wafers.

BRIEF DESCRIPTION OF DRAWINGS

FIGS. 4A to 4D are schematic side views showing an operation flow of a loading device according to the embodiment.

FIG. 5 is a schematic side view of the wafer stocker showing a gas circulation path according to the embodiment.

FIG. 11 is an exploded view of a wafer stocker according to another modification.

DETAILED DESCRIPTION

Embodiments of the present disclosure will now be described in detail with reference to the accompanying drawings.

A wafer stocker X (see FIG. 1) according to the present embodiment is provided in a clean room used in a semiconductor manufacturing process. The wafer stocker X can temporarily store wafers, which are taken out from a transfer container capable of accommodating the wafers, inside a housing 1 maintained in a high degree of cleanliness.

In the present embodiment, a FOUP 10 is used as a transfer container. As shown in FIGS. 4A to 4D, the FOUP 10 includes a FOUP main body Y3 (transfer container main body) having an internal space YS which is openable through a loading/unloading port Y1 as an opening, and a FOUP door Y2 (transfer container door) capable of opening and closing the loading/unloading port Y1. The FOUP 10 is configured to accommodate a plurality of wafers in a multi-stage shape in a height direction H, so that the wafers can be loaded and unloaded through the loading/unloading port Y1. FIGS. 4A to 4D are schematic views showing an operation flow for the FOUP 10, which follows the order of FIGS. 4A, 4B, 4C and 4D as will be described later.

Figure 4A:
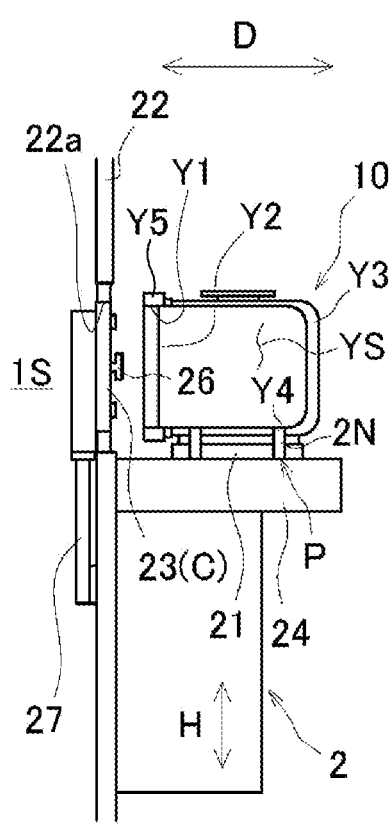

The FOUP main body Y3 includes a shelf portion (wafer mounting shelf) capable of mounting a plurality of wafers in multiple stages at a predetermined pitch in the internal space YS. As shown in FIG. 4A, a port Y4 is installed at a predetermined position on the bottom wall of the FOUP main body Y3. The port Y4 has, for example, a hollow cylindrical grommet seal fitted in a port mounting through-hole formed in the bottom wall of the FOUP main body Y3, and is configured to be openable and closable by a check valve. A flange portion to be gripped by a container transfer device such as an OHT or the like is installed at the central portion of the upward surface of the upper wall of the FOUP main body Y3.

The FOUP door Y2 is a substantially plate-like member. The FOUP door Y2 is arranged so as to face a loading device door 23 of a loading device 2 in a state of being mounted on a mounting table 21 (described later) of the loading device 2. The FOUP door Y2 is provided with a latch key (not shown) for locking the FOUP door Y2 to the FOUP main body Y3. A gasket Y5 is installed at a predetermined portion of the FOUP door Y2 that comes into contact with or is close to the FOUP main body Y3 in a state in which the loading/unloading port Y1 is closed by the FOUP door Y2. The FOUP door Y2 is configured so that the internal space YS of the FOUP 10 can be sealed by bringing the gasket Y5 into contact with the FOUP main body Y3 and elastically deforming the gasket Y5 (see FIGS. 4A and 4C).

In the stocker of the related art that stores the entire FOUP 10 therein, even if the atmosphere of the space where the FOUP 10 is stored is filled with nitrogen, dry air, or the like to achieve a higher degree of cleanliness, dust or the like adhering to the surface of the FOUP 10 in the clean room may be brought into the stocker and accumulated therein. Further, in general, the FOUP 10 is formed of a water-absorbent resin material (e.g., polycarbonate). Therefore, even if the internal space of the stocker in the related art is filled with nitrogen, dry air, or the like, the moisture introduced into the FOUP 10 in the clean room is diffused in the stocker. This makes it difficult to control and keep the humidity low in the internal space of the stocker. As described above, in the configuration in which the entire FOUP is stored in the stocker, it may be difficult to further improve the atmosphere around the wafers. Therefore, in order to make it possible to further improve the atmosphere around the wafers, the wafer stocker X of the present embodiment is configured specifically as follows.

Figure 1:
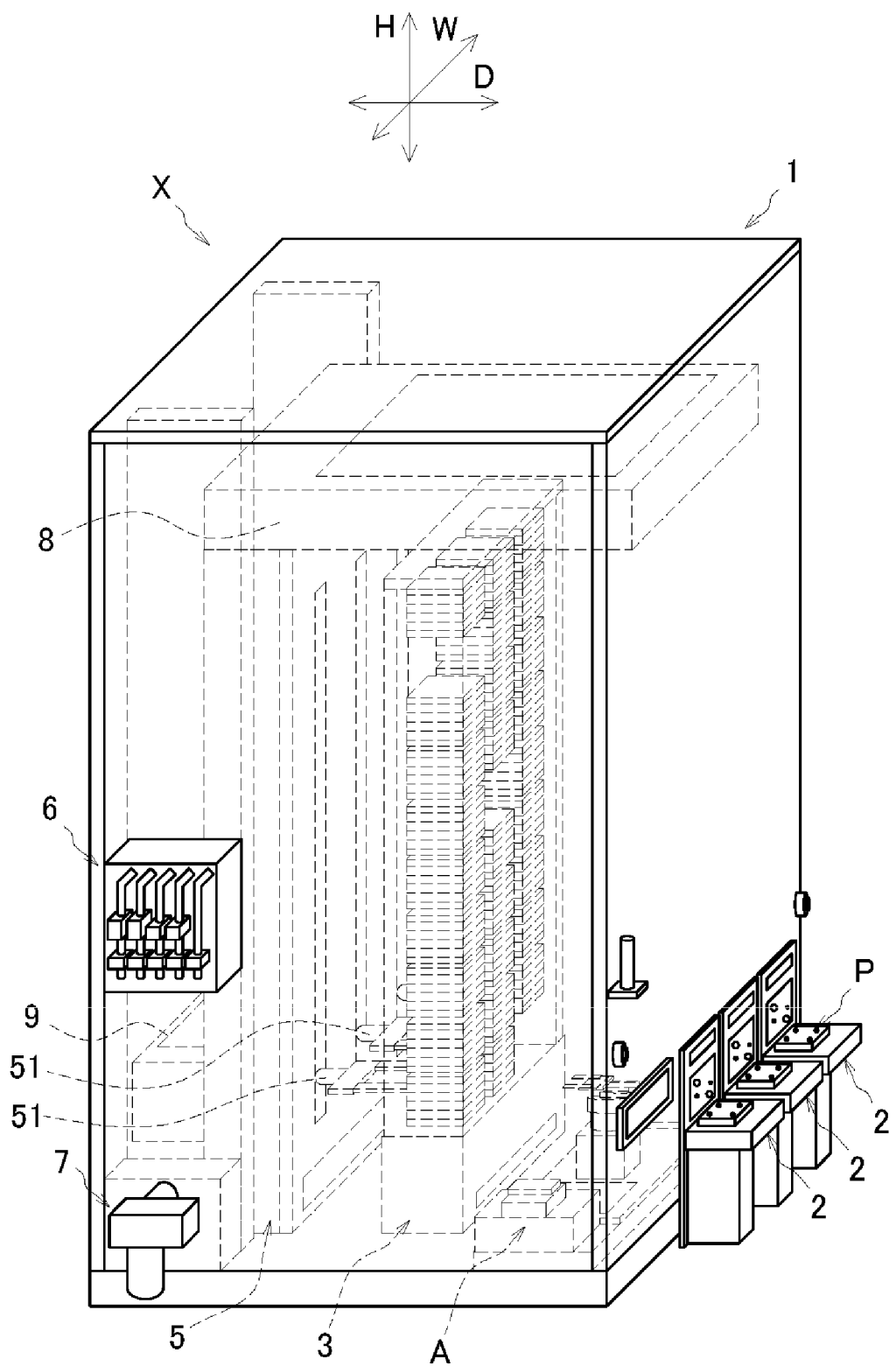
FIG. 1 is an overall schematic view of a wafer stocker according to an embodiment of the present disclosure.
Figure 2:
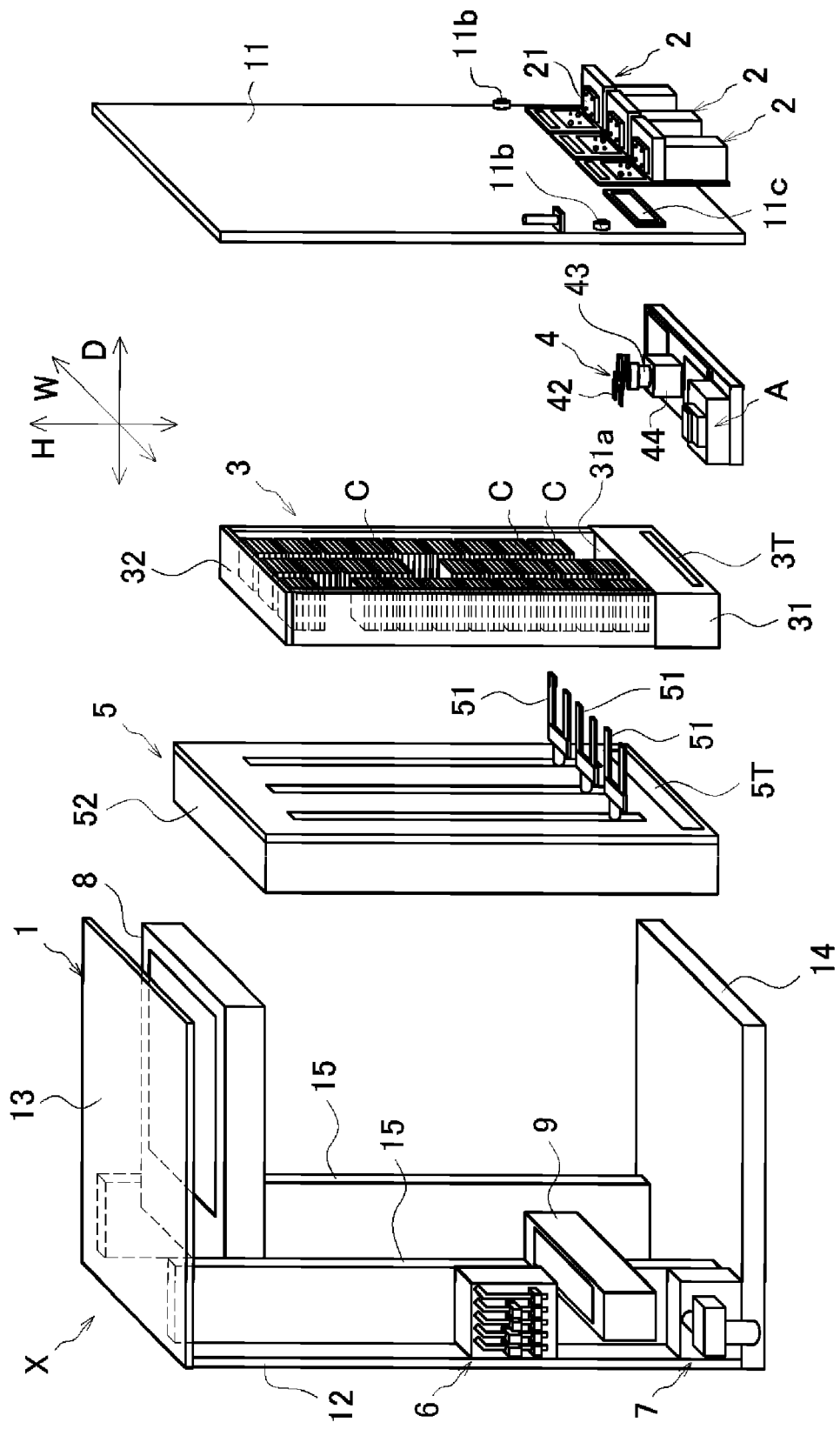
FIG. 2 is an exploded view of the wafer stocker shown in FIG. 1.

As shown in FIGS. 1 and 2, the wafer stocker X according to the present embodiment includes a housing 1, a loading device 2, a wafer cassette shelf 3, a wafer transfer robot 4, and a wafer cassette delivery device 5. The loading device 2 is arranged in close contact with a front wall 11 of the housing 1 so as to form a part of the front wall 11 of the housing 1. The loading device 2 includes a mounting table 21 on which a wafer can be mounted. The wafer cassette shelf 3 is installed in the housing 1 at a position spaced apart by a predetermined distance rearward from the front wall 11 of the housing 1, and is configured to store a plurality of wafer cassettes C smaller than the FOUP 10 in a multi-stage manner (in other words, store the plurality of wafer cassettes C in the height direction H). The wafer transfer robot 4 performs a wafer loading/unloading process with respect to the FOUP 10 on the mounting table 21 of the loading device 2. The wafer cassette delivery device 5 moves the wafer cassette C stored in a stage of the wafer cassette shelf 3 to another stage having a different height (i.e., the wafer cassette delivery device 5 moves the wafer cassette C in the height direction H). The wafer cassette C is a well-known open cassette that can store a plurality of wafers in a multi-stage manner (by arranging the wafers in the height direction H).

Figure 3:
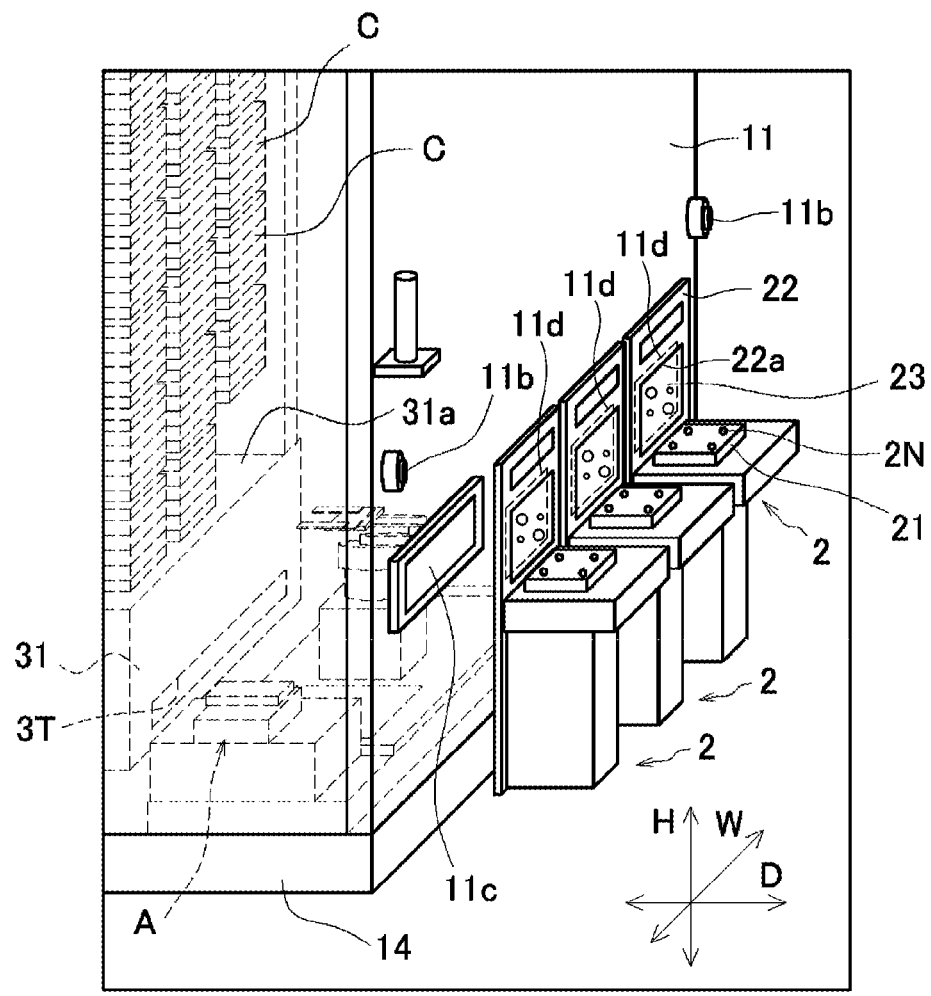
FIG. 3 is an enlarged view of a part of FIG. 1

The housing 1 has a hollow rectangular parallelepiped shape, and includes the front wall 11, a back wall 12, a ceiling wall 13, a floor base 14, and a pair of left and right side walls (not shown) extending forward from the vicinity of the left and right side edges of the back wall 12, respectively. The housing 1 can maintain an internal space 1S thereof in a substantially sealed state and keep the internal space 1S at a positive pressure (details will be described later). At a predetermined height position of the front wall 11, a housing window portion 11d penetrating in the front-rear direction D is formed. The wafers can be taken in and out through the housing window portion 11d. In the present embodiment, a plurality of housing window portions 11d (three housing window portions 11d in the illustrated example) is formed on the front wall 11 at a predetermined pitch along the width direction W. As shown in FIGS. 2 and 3, an emergency off (EMO) button 11b and a monitor 11c are installed on the front wall 11.

As shown in FIGS. 3 and 4A to 4D, the loading device 2 includes a plate-shaped standing base 22 arranged in an upright posture, a loading device door 23 for opening and closing an opening 22a formed in the standing base 22, and a mounting table 21 provided on the standing base 22 in a substantially horizontal posture. The loading device 2 is installed on the front surface of the housing 1. That is, the loading device 2 is arranged so that the standing base 22 is brought into close contact with the front wall 11 of the housing 1 from the front side of the housing 1. In this arrangement state, the opening 22a formed in the standing base 22 and the housing window portion 11d formed in the front wall 11 of the housing 1 overlap (communicate) with each other in the front-rear direction D.

The mounting table 21 is installed on the upper portion of a horizontal base 24 (support base) arranged to have a substantially horizontal posture at a position slightly above the center of the standing base 22 in the height direction H. The mounting table 21 may support the FOUP 10 in an orientation in which the FOUP door Y2 faces the loading device door 23. Further, the mounting table 21 is configured to be movable backward and forward with respect to the standing base 22. Specifically, the mounting table 21 is movable backward and forward between a predetermined docking position (see FIG. 4C) at which the FOUP door Y2 adjoins the opening 22a of the standing base 22 and a position (see FIGS. 4A and 4B) at which the FOUP door Y2 is spaced apart by a predetermined distance more than the docking position from the standing base 22. The mounting table 21 includes a plurality of protrusions (pins) (not shown) that protrude upward. By bringing these protrusions into engagement with holes (not shown) formed on the bottom surface of the FOUP 10, the FOUP 10 is positioned on the mounting table 21. Further, the mounting table 21 includes a lock claw (not shown) for fixing the FOUP 10. By hooking and fixing the lock claw to a locked portion (not shown) formed on the bottom surface of the FOUP 10 to put it in a locked state, the FOUP 10 may be guided to and fixed at an appropriate position on the mounting table 21 in cooperation with the positioning protrusions. Further, by releasing the locked state of the lock claw with respect to the locked portion formed on the bottom surface of the FOUP 10, the FOUP 10 can be separated from the mounting table 21.

The loading device door 23 includes a connecting mechanism 26 for connecting the loading device door 23 and the FOUP door Y2, and is configured to be movable along a predetermined movement path while holding the FOUP door Y2 with the connecting mechanism 26. The connecting mechanism 26 may be switched between a lid connection state in which the loading device door 23 and the FOUP door Y2 are connected and a lid connection release state in which the connection of the loading device door 23 and the FOUP door Y2 is released. In the lid connection state, the FOUP door Y2 can be removed from the FOUP main body Y3. In the lid connection release state, the FOUP door Y2 is attached to the FOUP main body Y3. The loading device door 23 is configured to be movable at least between a fully closed position (C) shown in FIG. 4A or the like and an open position (not shown). The fully closed position (C) is the position of the loading device door 23 when the internal space YS of the FOUP main body Y3 is sealed by the FOUP door Y2. The opening position is the position of the loading device door 23 when the FOUP door Y2 is separated from the FOUP main body Y3 and the internal space YS of the FOUP main body Y3 is opened toward the internal space 1S of the housing 1. The loading device 2 may move the loading device door 23 from the fully closed position to the open position while maintaining an upright posture of the loading device door 23, and may further move the loading device door 23 downward from the open position to a fully open position (O) shown in FIG. 4D while maintaining the upright posture. Such movement of the loading device door 23 is implemented by a door moving mechanism 27 installed in the loading device 2. In addition, the loading device 2 includes a movement restricting portion (not shown) that restricts the movement of the FOUP 10 on the mounting table 21 positioned at the docking position away from the standing base 22.

The loading device 2 includes a purging device P (see FIGS. 4A to 4D). The purging device P is configured to inject an inert gas such as a nitrogen gas or the like or a purging gas such as dry air or the like into the internal space YS of the FOUP 10 to replace the atmosphere of the internal space YS of the FOUP 10 with the purging gas. The purging device P may replace the atmosphere of the internal space YS of the FOUP 10 with an inert gas of the same type as the inert gas supplied from the below-described gas introduction device 6 to the internal space 1S of the housing 1. The purging device P includes a plurality of purging nozzles 2N (gas supply/discharge devices) which is arranged at predetermined positions on the mounting table 21 while the upper ends thereof may be exposed. The purging nozzles 2N are attached to appropriate positions on the mounting table 21 according to the positions of the ports Y4 formed on the bottom surface of the FOUP 10, and can be connected to the ports Y4. Using such a purging device P, the following bottom purging process is performed. First, the purging device P causes some of the ports Y4 to function as "supply ports," and injects an appropriately-selected purging gas such as a nitrogen gas, an inert gas or dry air into the FOUP 10 via the purging nozzles 2N connected to the supply ports. At the same time, the purging device P causes the remaining ports Y4 to function as "exhaust ports" and discharges the gas in the FOUP 10 via the purging nozzles 2N connected to the exhaust ports. As a result, the FOUP 10 is filled with the purging gas.

The loading device 2 of the present embodiment includes a mapping part (not shown) capable of detecting the presence or absence and storage posture of a wafer in the FOUP 10.

A plurality of such loading devices 2 (three loading devices 2 in the illustrated example) is arranged side by side along the width direction W of the housing 1 on the front side of the housing 1.

As shown in FIGS. 1 and 2, the wafer cassette shelf 3 includes a wafer cassette shelf base 31 and a shelf main body 32 supported by the wafer cassette shelf base 31. The shelf main body 32 is formed by integrally assembling a plurality of shelf plates (not shown) arranged in a stage-like manner and a shelf frame having side walls that can support both ends of each of the shelf plates. The wafer cassette shelf 3 of the present embodiment can store wafer cassettes C in 10 stages in the height direction H. The lowermost mounting space of the wafer cassette C (first-stage mounting space) is set on an upper surface 31a of the wafer cassette shelf base 31, and the second and higher wafer cassettes C from the bottom can be mounted on the shelf plates, respectively. In the present embodiment, the upper surface 31a of the wafer cassette shelf base 31 and the upper surface of the mounting table 21 of the loading device 2 are set at substantially the same height position.

The separation pitches of the wafer cassettes C stored in the wafer cassette shelf 3 in a multiple-stage manner in the height direction H may be equal intervals. Alternatively, the separation pitches between the shelves may be appropriately changed in consideration of, for example, the arrangement locations of parts (e.g., beams (not shown) and the like) that constitute the wafer cassette shelf 3. The wafer stocker X of the present embodiment is set so that the wafer cassettes C of the same row number as the number of loading devices 2 can be placed on the wafer cassette shelf 3. That is, in the present embodiment, the wafer cassette shelf 3 on which the wafer cassettes C can be placed in three rows in the width direction W is applied.

The wafer transfer robot 4 is installed between the front wall 11 of the housing 1 and the wafer cassette shelf 3. The wafer transfer robot 4 can execute a process of taking out a wafer from the FOUP 10 mounted on the mounting table 21 of the loading device 2 and delivering the wafer to the wafer cassette C stored in the wafer cassette shelf 3. Further, the wafer transfer robot 4 can execute a process of taking out a wafer from the wafer cassette C of the wafer cassette shelf 3 and putting the wafer back into the FOUP 10. As shown in FIG. 2, the wafer transfer robot 4 includes, for example, an arm mechanism 42 in which wafer gripping portions (hands) are installed at the tips of a plurality of link elements connected to each other so as to be horizontally swivel, and a base portion 43 configured to support the arm mechanism 42. The wafer transfer robot 4 has a link structure (articulated structure) in which the shape thereof is changed between a folded state in which the arm length of the arm mechanism 42 is minimized and an extended state in which the arm length is longer than in the folded state. A plurality of individually controllable wafer gripping portions may be installed at the tip of the arm mechanism 42 in a multi-stage shape in the height direction H.

As shown in FIG. 5, the space in the internal space 1S of the housing 1 in which the wafer transfer robot 4 is installed is a space in front of the wafer cassette shelf 3 in the front-rear direction D and a space (wafer transfer space) functioning as a wafer transfer chamber 4S. In the present embodiment, as shown in FIG. 1 and the like, one wafer transfer robot 4 and one wafer aligner A are installed in the wafer transfer chamber 4S.

The wafer transfer robot 4 includes an exhaust box 44 that communicates with the internal space of the base portion 43. Dust generated from a drive mechanism (drive mechanism of the arm mechanism 42) or the like installed in the base portion 43 is forcibly collected in the exhaust box 44 set to a negative pressure (see FIG. 5).

As shown in FIGS. 1 and 2, the wafer cassette delivery device 5 is configured to move the wafer cassette C stored in the wafer cassette shelf 3 to at least a stage having a different height in the wafer cassette shelf 3. The wafer cassette delivery device 5 includes a wafer cassette transfer arm 51 that can move in the front-rear direction D and the height direction H, and a wafer cassette delivery device frame 52 that supports the wafer cassette transfer arm 51. In the present embodiment, the wafer cassette transfer arm 51 has a hand having a bifurcated tip portion. However, the present disclosure is not limited thereto. Further, the wafer cassette delivery device frame 52 has a substantially rectangular parallelepiped shape, and includes a drive mechanism installed therein so as to move the wafer cassette transfer arm 51 up and down and forward and backward. In the wafer cassette delivery device 5, as shown in FIG. 2, the same number of wafer cassette transfer arms 51 as the number of rows of wafer cassettes C (three rows in the present embodiment) that can be placed on the wafer cassette shelf 3 are arranged side by side in the width direction W. Further, the wafer cassette delivery device 5 is configured to deliver the wafer cassette C of the row facing each wafer cassette transfer arm 51 in the same row in the height direction H. As shown in FIG. 5, a space (wafer cassette transfer space) functioning as a wafer cassette transfer chamber 5S that allows the wafer cassette C to move in the height direction H is formed between the wafer cassette delivery device frame 52 and the wafer cassette shelf 3.

As shown in FIGS. 1, 2 and 5, the wafer stocker X includes a gas introduction device 6, an exhaust device 7, and a fan filter unit (FFU) 8. The gas introduction device 6 supplies an inert gas into the housing 1. The exhaust device 7 discharges the gas in the internal space 1S of the housing 1. The fan filter unit 8 passes the inert gas supplied from the gas introduction device 6 and generates a downward air flow (laminar flow) in the space (the space including the wafer cassette transfer chamber 5S and the wafer transfer chamber 4S) extending from the wafer cassette delivery device 5 to the front wall 11 of the housing 1.

The gas introduction device 6 includes a mass flow controller 61 (MFC) and a gas introduction pipe 62 (see FIG. 5). The mass flow controller 61 is installed at a predetermined position in the housing 1 behind the wafer cassette delivery device 5 to control the flow rate while measuring the mass flow rate of a fluid. The gas introduction pipe 62 is a pipe for supplying an inert gas (nitrogen gas in the present embodiment) to the internal space 1S of the housing 1 via the mass flow controller 61. The gas introduction pipe 62 includes a gas introduction start end pipe 63, a gas introduction vertical pipe 64, and a gas introduction horizontal pipe 65. The gas introduction start end pipe 63 is a pipe installed at a rear end portion of the housing 1 and communicating with a valve 61v of the mass flow controller 61. The gas introduction vertical pipe 64 extends from the front end (tip end) of the gas introduction start end pipe 63 to the vicinity of the ceiling wall 13 of the housing 1 along the inward surface of the back wall 12 of the housing 1. The gas introduction horizontal pipe 65 extends from the upper end of the gas introduction vertical pipe 64 to the vicinity of the front wall 11 of the housing 1 along the ceiling wall 13 of the housing 1. The gas introduction horizontal pipe 65 has downwardly-opened holes (downward holes) formed at a predetermined pitch in the front-rear direction. As a result, the inert gas that reaches the gas introduction horizontal pipe 65 from the valve 61v of the mass flow controller 61 via the gas introduction start end pipe 63 and the gas introduction vertical pipe 64 is supplied from the downward holes of the gas introduction horizontal pipe 65 to the internal space 1S of the housing 1 (see FIG. 5).

The fan filter unit 8 is a combination of a fan and a filter, and exhibits an air purifying function. In the wafer stocker X of the present embodiment, the fan filter unit 8 is arranged in a region that extends from the upper end of the wafer cassette delivery device 5 (the upper end of the wafer cassette delivery device frame 52) to the inward surface of the front wall 11 of the housing 1. The inert gas supplied to the internal space 1S of the housing 1 by the gas introduction device 6 is sent to the wafer cassette transfer chamber 5S and the wafer transfer chamber 4S as a highly clean down-flow (laminar flow) by the fan filter unit 8.

As shown in FIG. 5, the exhaust device 7 includes an automatic pressure controller (APC) 71 and an exhaust port 72 communicating with a valve 71v of the automatic pressure controller 71. The automatic pressure controller 71 is installed in the housing 1 on the rear side of the wafer cassette delivery device 5 and on the lower side of the mass flow controller 61 of the gas introduction device 6. The gas in the down-flow generated by the fan filter unit 8 reaches the vicinity of the floor base 14 of the housing 1 via the space between the wafer cassette delivery device 5 and the front wall 11 of the housing 1, and flows toward the exhaust port 72. A predetermined amount of gas is discharged to the outside of the housing 1 via the exhaust port 72 and the valve 71v of the automatic pressure controller 71. In the present embodiment, passage paths 3T and 5T through which the air flow flowing toward the exhaust device 7 can pass are formed in the lower end portion of the wafer cassette shelf 3 and the lower end portion of the wafer cassette delivery device 5, respectively (see FIGS. 2 and 5). Further, the exhaust device 7 includes an exhaust horizontal pipe 73 extending from the exhaust box 44 of the wafer transfer robot 4 toward the exhaust port 72. The dust and the like collected in the exhaust box 44 of the wafer transfer robot 4 are discharged to the outside of the housing 1 via the exhaust horizontal pipe 73 and the exhaust port 72.

In the wafer stocker X of the present embodiment, a part of the gas flowing toward the exhaust device 7 is discharged, and most of the remaining gas is set to rise along the back wall 12 of the housing 1. Specifically, as shown in FIGS. 1, 2 and 5, a pair of left and right partition walls 15 is installed and erected in the housing 1. A tubular space TS as a return space for returning the gas to the fan filter unit 8 is formed by the partition walls, the back wall of the wafer cassette delivery device 5, and the back wall 12 of the housing 1. Further, a blower 9 is installed between the wafer cassette delivery device 5 and the back wall 12 of the housing 1 and at a position higher than the exhaust port 72 of the exhaust device 7. The blower 9 generates a rising air flow in the tubular space TS. In the housing 1, the gas in the rising air flow generated by the blower 9 joins the air flow flowing toward the front wall 11 of the housing 1 when the gas reaches the vicinity of the ceiling wall 13 of the housing 1. Then, the gas passes through the fan filter unit 8 together with the inert gas supplied downward from the gas introduction horizontal pipe 65 of the gas introduction device 6, and flows along the air flow flowing downward. As described above, a gas circulation path for circulating most of the inert gas supplied from the gas introduction device 6 is formed in the housing 1.

In the wafer stocker X having such a configuration, the inert gas is circulated in the housing 1 to maintain the internal space 1S of the housing 1 at a positive pressure, which makes it possible to prevent the atmosphere outside the housing 1 from entering the housing 1. Specifically, the automatic pressure controller 71 controls the flow of the gas so that the pressure in the entire gas circulation path becomes a positive pressure with respect to the atmosphere outside the housing 1. More specifically, the pressure in the space (storage area) in which the wafer cassette C is stored is controlled so as to be, for example, 10 to 300 Pa (gauge pressure). More preferably, the pressure in the storage area is controlled to, for example, 10 to 100 Pa (gauge pressure), or a low positive pressure (a slightly positive pressure). As a result, the space in which a large number of wafer cassettes C are stored and the space in which the wafers are transferred can be in a highly clean space, and the wafer characteristics can be maintained by an atmosphere having a low oxygen concentration (e.g., 10 to 100 ppm) and a low humidity (e.g., dew point temperature of −50 degrees C. or less).

Next, the operation flow of the wafer stocker X according to the present embodiment will be described with reference to FIGS. 4A to 4D and 6 to 9. In FIGS. 6 to 9, the front wall 11 and the partition walls 15 of the housing 1 are omitted for the sake of convenience of explanation.

First, the FOUP 10 is placed on the mounting table 21 of the loading device 2 by a container transfer device such as an OHT or the like (see FIG. 4A). At this time, for example, the positioning protrusion provided on the mounting table 21 fits into the positioning recess of the FOUP 10 to bring the lock claw on the mounting table 21 into a locked state (locking process). In the present embodiment, the FOUP 10 can be mounted on each of the three mounting tables 21 of the loading devices 2 arranged side by side in the width direction W. Further, a seating sensor (not shown) that detects whether or not the FOUP 10 is mounted at a predetermined position on the mounting table 21 may be configured to detect that the FOUP 10 is mounted at a normal position on the mounting table 21.

Figure 4B:
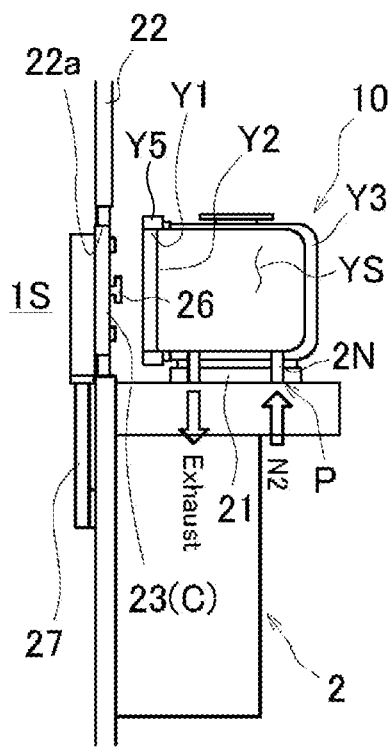

In the loading device 2 of the present embodiment, when the FOUP 10 is placed at a predetermined normal position on the mounting table 21, it is detected that the bottom surface portion of the FOUP 10 presses the pressed portion of, for example, a pressure sensor installed on the mounting table 21. With this as a trigger, all the purging nozzles 2N installed on the mounting table 21 are moved to above the upper surface of the mounting table 21 and are connected to the respective ports Y4 of the FOUP 10. As a result, the respective ports Y4 are switched from the closed state to the open state. Then, the loading device 2 performs a process (bottom purging process) of supplying a nitrogen gas, which is an inert gas, to the internal space YS of the FOUP 10 by the purging device P and replacing the internal space YS of the FOUP 10 with the nitrogen gas (FIG. 4B). During the bottom purging process, the gas in the FOUP 10 is discharged to the outside of the FOUP 10 via the purging nozzles 2N connected to the ports Y4 that function as exhaust ports. FIG. 4B schematically shows the supply direction of the nitrogen gas and the discharge direction of the gas in the FOUP 10 during the bottom purging process by arrows. By such a bottom purging process, the loading device 2 reduces the water concentration and the oxygen concentration in the FOUP 10 to predetermined values or less, respectively, and changes the environment around the wafers in the FOUP 10 to a low humidity environment and a low oxygen environment.

After the locking process, the loading device 2 of the present embodiment moves the mounting table 21 located at the position shown in FIG. 4B to the docking position shown in FIG. 4C (docking process). Next, the loading device 2 performs a process of holding and fixing at least both sides of the FOUP 10 by using a movement restricting part (clamping process), and switches the connecting mechanism 26 to the lid connecting state (lid connecting process). Further, the loading device 2 executes a process (sealing release process) in which the sealed state of the inside of the FOUP 10 is released by moving the FOUP door Y2 together with the loading device door 23 to open the opening 22a of the standing base 22 and the loading/unloading port Y1 of the FOUP 10 (see FIG. 4D). The loading device 2 may be configured to perform a mapping process by the mapping part during the process of moving the loading device door 23 from the open position to the fully open position (0). Thus, it is possible to sequentially detect the presence or absence and the storage posture of the wafers stored and arranged in the height direction H in the FOUP 10.

By executing the sealing release process, the internal space YS of the FOUP main body Y3 and the internal space 1S of the housing 1 are brought into communication with each other. Thereafter, the wafer transfer robot 4 performs the following wafer transfer process based on the information (wafer position) detected in the mapping process. That is, the wafer transfer robot 4 transfers the wafer in the FOUP 10 to the wafer cassette C stored in the wafer cassette shelf 3, and transfers the wafer in the wafer cassette C to the FOUP 10.

Figure 6:
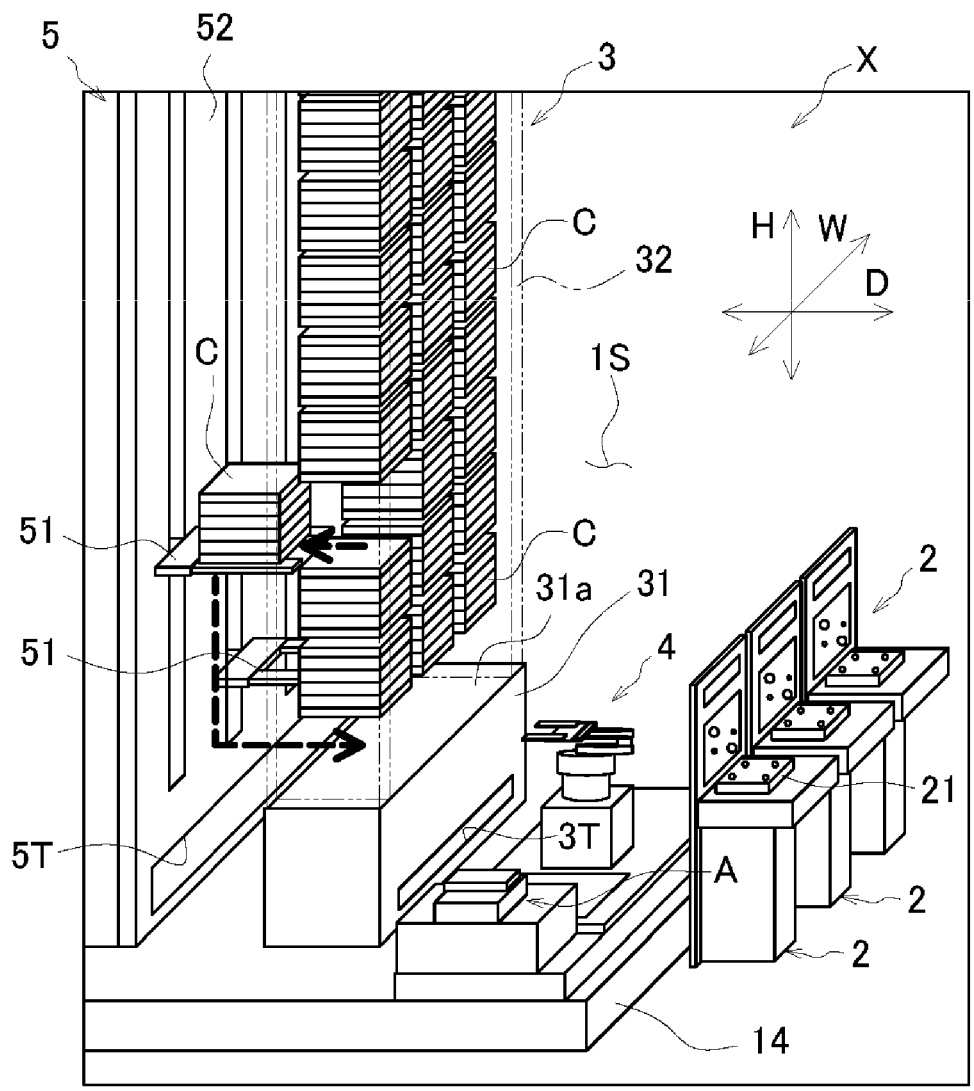
FIG. 6 is a view showing an operation flow of the wafer stocker according to the embodiment corresponding to FIG. 1.

In the wafer stocker X, the mounting space of the first stage of the wafer cassette shelf 3 (specifically, the upper surface 31a of the wafer cassette shelf base 31) is set as a delivery position of the wafer delivered by the wafer transfer robot 4 with respect to the wafer cassette C. Therefore, before the wafer transfer process (the process of transferring the wafer in the FOUP 10 into the wafer cassette C), the wafer stocker X performs the following process. First, for example, as shown in FIG. 6, when viewed from the front, the wafer cassette C is not placed in the first stage of the left row of the wafer cassette shelf 3 (idle state). In this state, the wafer stocker X delivers the wafer cassette C stored in the stage (the third stage in the illustrated example) above the second stage in the same row to the first stage of the wafer cassette shelf 3 by the wafer cassette delivery device 5 (wafer cassette delivery process) (see FIG. 7).

In FIG. 6, the transfer path of the wafer cassette C transferred by the wafer cassette transfer arm 51 is schematically indicated by an arrow.

Figure 7:
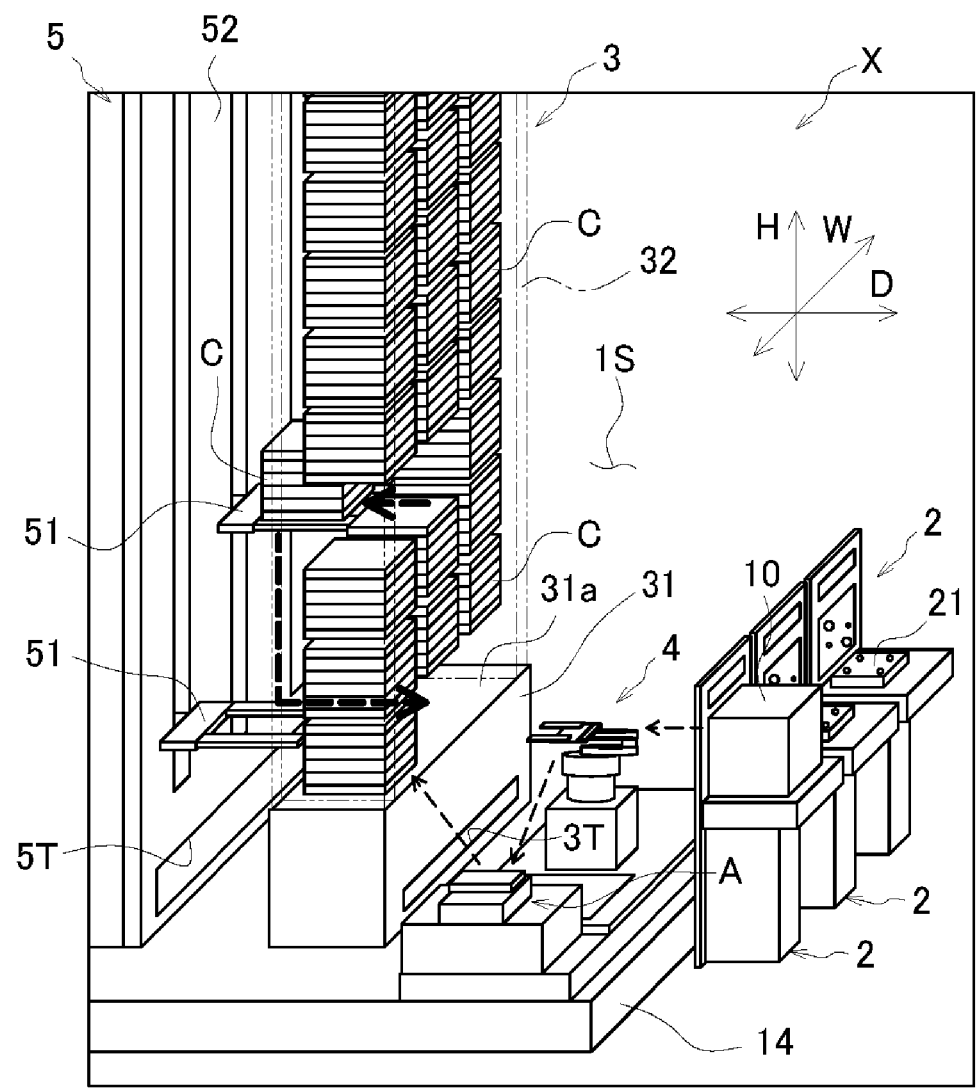
FIG. 7 is a view showing an operation flow of the wafer stocker according to the embodiment corresponding to FIG. 1.

As shown in FIG. 7, the wafer stocker X performs the following "next use wafer cassette delivery process" during the wafer transfer process in which the wafer is delivered between the wafer cassette C set in the first stage of the wafer cassette shelf 3 and the FOUP 10. That is, the wafer stocker X delivers the wafer cassette C to be used in the next wafer processing to the idle space in the first-stage mounting space of the wafer cassette shelf 3 by the wafer cassette delivery device 5. FIG. 7 shows a state in which the wafer cassette C stored in the stage (the third stage in the illustrated example) above the second stage of the central row of the wafer cassette shelf 3 is delivered to the center of the first-stage mounting space of the wafer cassette shelf 3 as a "next use wafer cassette." In FIGS. 7 to 9, the transfer path of the wafer cassette C transferred by the wafer cassette transfer arm 51 is schematically shown by relatively thick arrows, and the transfer path of the wafer transferred by the wafer transfer robot 4 is schematically shown by relatively thin arrows. The wafer transfer robot 4 delivers the wafer between the FOUP 10 mounted on the loading device 2 and the wafer cassette C arranged in the stage of a height facing the transfer container in the front-rear direction among the plurality of stages of the wafer cassette shelf 3.

The wafer stocker X performs the following sealing process on the FOUP 10 for which the wafer transfer process has been completed. First, the wafer stocker X moves the loading device door 23 to the fully closed position (C) by the door moving mechanism 27 of the loading device 2, and closes the opening 22a of the standing base 22 and the loading/unloading port Y1 of the FOUP 10. Subsequently, the loading device 2 executes a process of switching the connecting mechanism 26 from the lid connection state to the lid connection release state (lid connection release process). By this process, the internal space YS of the FOUP 10 is brought into a sealed state.

Subsequently, the loading device 2 performs a clamp release process of releasing the fixed state (clamped state) of the FOUP 10 kept by the movement restricting part. Next, the loading device 2 executes a process of moving the mounting table 21 away from the standing base 22 (docking release process), and then releases the state in which the FOUP 10 is locked by the lock claw on the mounting table 21 (unlock process). As a result, the FOUP 10 is delivered from the mounting table 21 of each loading device 2 to the container transfer device, and is carried to, for example, the mounting table of the load port constituting the EFEM (Equipment Front End Module).

Figure 8:
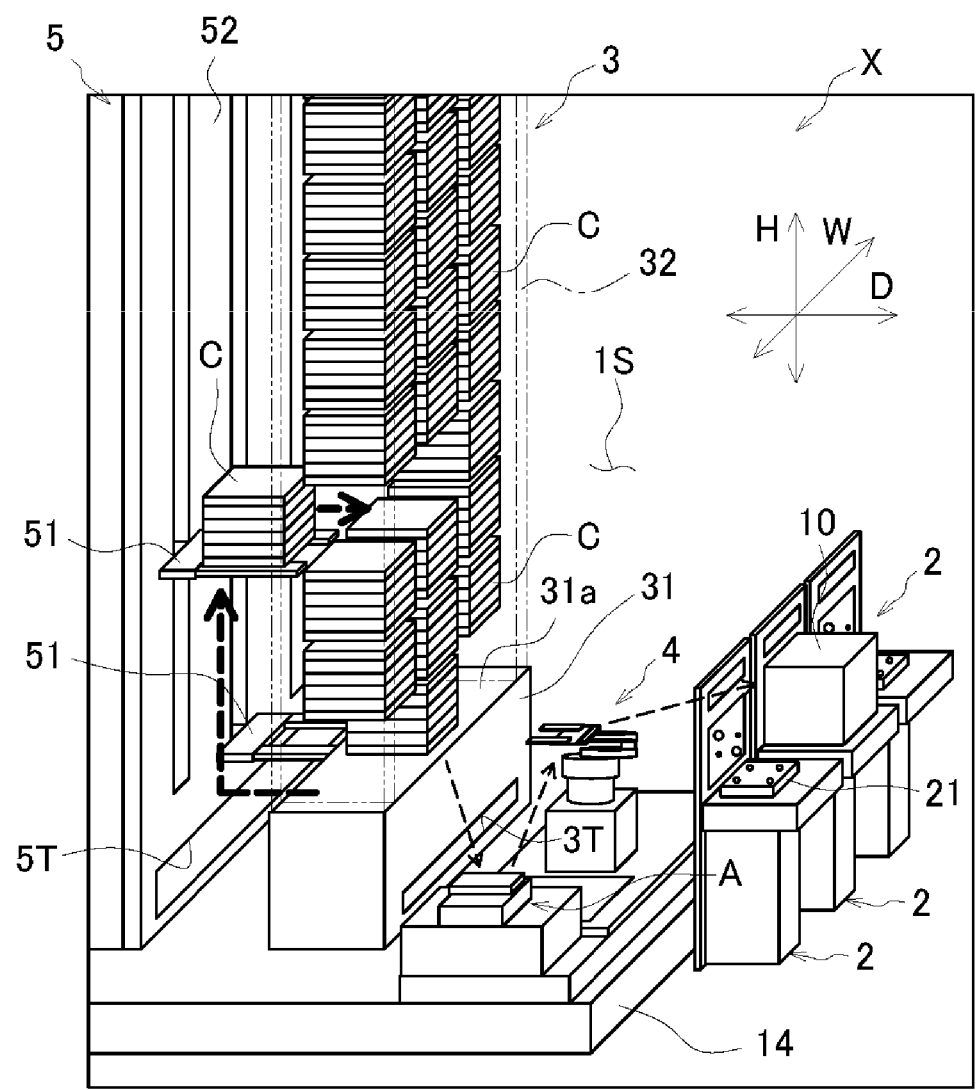
FIG. 8 is a view showing an operation flow of the wafer stocker according to the embodiment corresponding to FIG. 1.

On the other hand, the wafer cassette C subjected to the wafer transfer process is delivered from the first-stage mounting space of the wafer cassette shelf 3 to the original-stage mounting space by the wafer cassette delivery device 5 at an appropriate timing after the sealing process is performed by the loading device 2 (wafer cassette return process). As shown in FIG. 8, the wafer cassette return process can be executed during the wafer transfer process performed by using another wafer cassette C different from the target of the wafer cassette return process.

Figure 9:
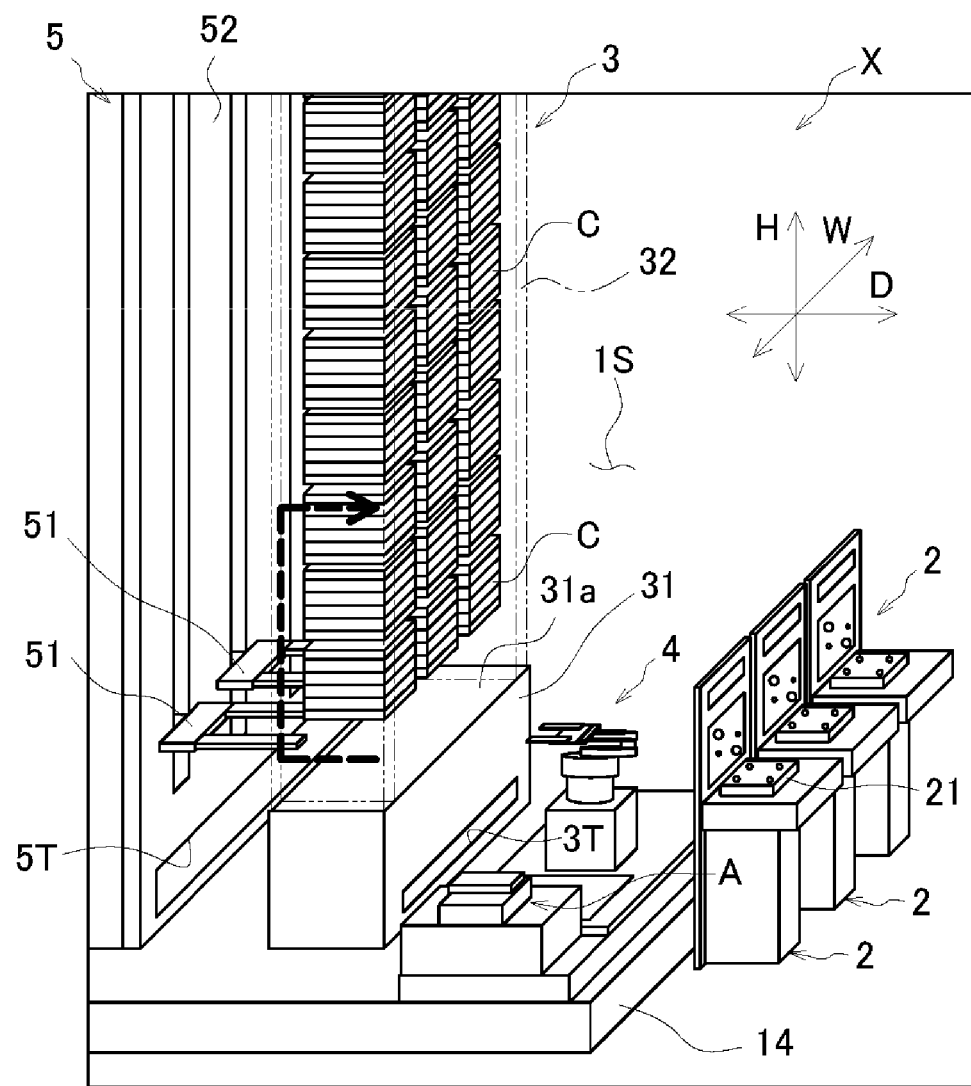
FIG. 9 is a view showing an operation flow of the wafer stocker according to the embodiment corresponding to FIG. 1.

As described above, the wafer stocker X can repeatedly perform the wafer transfer process as needed in a state in which a large number of wafer cassettes C accommodating wafers in multiple stages or a large number of wafer cassettes C not accommodating wafers are stored in the housing 1. FIG. 9 shows a state in which the FOUP 10 on the loading device 2 is carried out from the state shown in FIG. 8 to the next process, and the wafer cassette C for which the wafer transfer process has been completed is returned from the first-stage mounting space of the wafer cassette shelf 3 to the original-stage mounting space.

The wafer transfer process using the wafer transfer robot 4 is either a process of delivering the wafer in the FOUP 10 to the wafer cassette C of the wafer cassette shelf 3, or a process of delivering the wafer stored in the wafer cassette C into the FOUP 10. The process to be performed may be appropriately selected. Further, the wafer in the FOUP 10 may be delivered to the wafer cassette C via the wafer aligner A installed in the wafer transfer chamber 4S, or the wafer of the wafer cassette C may be delivered into the FOUP 10 via the wafer aligner A (see FIGS. 7 and 8). The operation of the wafer stocker X is controlled by a controller (not shown).

As described above, according to the wafer stocker X of the present embodiment, the inert gas can be supplied into the housing 1 by the gas introduction device 6, and the plurality of wafer cassettes C can be stored in a multi-stage manner in the positive-pressure housing 1 kept in a low oxygen concentration and a low water concentration and maintained in a high degree of cleanliness. As a result, the entry of the atmosphere from the outside can be prevented, and the outgas or the like generated from the wafer after the semiconductor processing process can be blown down by the down-flow generated by the fan filter unit 8 and can be discharged to the outside of the housing 1 by the exhaust device 7. In particular, since the wafer stocker X can store a large number of wafers, it is difficult to supply the entire amount of the inert gas from the outside in order to form a laminar flow. Therefore, it is effective to suppress the increase in running cost by forming the circulation path of the inert gas in the internal space 1S of the housing 1.

Further, the wafer stocker X according to the present embodiment has a configuration in which the wafers are stored in units of wafer cassettes C capable of accommodating the wafers in multiple stages. Therefore, as compared with the FOUP stocker in the related art that accommodates the entire FOUP 10 therein, it is possible to prevent the dust adhering to the outer surface of the FOUP 10 and the moisture introduced onto the outer surface of the FOUP from being released inside the stocker. Accordingly, it is possible to suppress a decrease in the degree of cleanliness inside the stocker. Furthermore, with such a configuration, it is possible to prevent or suppress a situation in which outgas or the like generated from the wafer after the semiconductor processing process enters and scatters in the stocker. As a result, it is possible to prevent or suppress a situation in which the wafer is contaminated in the housing 1 of the wafer stocker X or in the internal space YS of the FOUP 10 communicating with the internal space 1S of the housing 1. That is, according to the wafer stocker X of the present embodiment, it is possible to always maintain a high degree of cleanliness around the wafers and to prevent or suppress a situation in which particles and moisture adhere to the wafer surface. Accordingly, it is possible to further improve the atmosphere around the wafers in the stocker.

Further, the wafer stocker X of the present embodiment has a configuration in which the wafer is generally stored using the wafer cassette C smaller than the FOUP 10. Therefore, as compared with the stocker in the related art that accommodates the FOUP therein, it is possible to reduce the size of the wafer stocker X as a whole and to reduce the footprint of the wafer stocker X. Alternatively, as compared with the stocker in the related art that accommodates the entire FOUP therein, it is possible to increase the number of wafers that can be accommodated in the wafer stocker X, while suppressing the increase in the size of the entire apparatus. Moreover, the wafer stocker X according to the present embodiment has a configuration in which the wafer cassette C stored in the wafer cassette shelf 3 is delivered inside the housing 1. Therefore, as compared with the stocker in the related art in which the entire FOUP is delivered in the housing, the delivery space in the housing can be made compact.

Further, the wafer stocker X is configured so that the wafer cassettes C can be stored in a plurality of rows along the width direction W in the wafer cassette shelf 3, and includes the loading devices 2 and the wafer cassette transfer arms 51 corresponding to the number of rows. Therefore, it is possible to efficiently perform the delivery process of the wafer cassette C and the wafer transfer process.

Further, among the wafer cassettes C stored in the wafer cassette shelf 3, the wafer cassette C arranged at the height position facing the FOUP 10 mounted on the mounting table 21 of the loading device 2 in the front-rear direction D (specifically, the wafer cassette C mounted in the first-stage mounting space) is set to the wafer cassette C to which the wafer is delivered by the wafer transfer robot 4. That is, the wafer transfer robot 4 delivers the wafer between the FOUP 10 mounted on the loading device and the wafer cassette C arranged in the stage of a height facing the FOUP 10 in the front-rear direction among the plurality of stages of the wafer cassette shelf 3. Therefore, as compared with a configuration in which the wafer is delivered by the wafer transfer robot 4 from the FOUP 10 to the wafer cassette C at a height position not facing the FOUP 10 mounted on the mounting table 21 of the loading device 2 in the front-rear direction D among the wafer cassettes C stored in the wafer cassette shelf 3, for example, the height of the delivery position of the wafer delivered by the wafer transfer robot 4 can be limited to a predetermined range. Accordingly, it is possible to shorten the takt time of the wafer transfer robot 4 that transfers the wafer between the FOUP 10 and the wafer cassette C.

As a specific storage form of the wafer cassette C in the wafer cassette shelf 3 of the wafer stocker X, there may be a form in which the wafer cassette C accommodating frequently used wafers is stored in a mounting space closer to the first-stage mounting space. As a result, it is possible to shorten the access time for the wafers which are expected to be used preferentially. In addition, the wafers with a relatively high degree of pollution (the wafers that generate a large amount of outgas) are set to be stored in the mounting space of the stage below the wafers with a relatively low degree of pollution, which makes it possible to suppress spreading of pollution. Further, the wafer degassed by long-term storage in the housing may be moved to the upper stage.

According to the wafer stocker X of the present embodiment, it is possible to partition the storage locations in the wafer cassette shelf 3 depending on the type and state of the wafer, the semiconductor processing process applied to the wafer, and the like. Appropriate partitions may be installed in the wafer cassette shelf 3 to define the partition range.

Furthermore, in the present embodiment, the loading device 2 of the wafer stocker X has the same or similar configuration as the load port that constitutes the EFEM, which makes it possible to save the labor and time in designing and manufacturing a new loading device.

Although the embodiment of the present disclosure has been described above, the present disclosure is not limited to the configuration of the above-described embodiment. For example, it may be possible to appropriately change the number of stages of the wafer cassette shelf (the number of mounting spaces of the wafer cassette in the height direction) and the number of rows of the wafer cassette shelf (the number of mounting spaces of the wafer cassette in the width direction).

As the wafer cassette delivery device, it may be possible to use a device provided with a wafer cassette transfer arm that can move in the width direction of the housing in addition to moving up and down. With such a wafer cassette delivery device, the wafer cassettes stored in the wafer cassette shelf can be moved to different rows by the wafer cassette transfer arm.

Further, as the wafer cassette shelf, it may be possible to use a rotary shelf that rotates in a horizontal plane. In this case, for example, a plurality of wafer cassette mounting spaces (e.g., four wafer cassette mounting spaces at a 90-degree pitch) may be provided at a predetermined angle pitch in the circumferential direction orthogonal to the height direction H. Then, the wafer cassette mounted in each of the wafer cassette mounting spaces may be configured to take a rotation angle posture facing the wafer transfer robot or the wafer cassette transfer arm. In this way, the wafer transfer robot or the wafer transfer arm may be allowed to access the wafer cassette mounting spaces. By doing so, it is possible to efficiently perform the wafer transfer process and the wafer cassette delivery process.

Furthermore, as the wafer cassette stored in the wafer cassette shelf, it may also be possible to use a wafer cassette that can be accessed from a total of four directions, i.e., one side and the other side in the width direction W and one side and the other side in the front-rear direction D.

The wafer cassette delivery device may be capable of storing the wafer cassettes in a plurality of stages along the height direction of one row.

Further, the wafer cassette mounted in the mounting space of the stage other than the first stage of the wafer cassette shelf may be configured to be located at a height position facing the transfer container mounted on the loading device in the front-rear direction. In such a configuration, it may also be possible to set the wafer cassette located at the height position as the "wafer cassette to be delivered by the wafer transfer robot." That is, the wafer stocker of the present disclosure also has a configuration in which the wafer cassette placed in the second or higher stage is set as the "wafer cassette to be delivered by the wafer transfer robot."

In the above-described embodiment, the FOUP is adopted as the transfer container. However, in the present disclosure, it may also be possible to use a transfer container other than the FOUP such as a MAC (Multi Application Carrier), an H-MAC (Horizontal-MAC), an FOSB (Front Open Shipping Box), or the like.

Further, as the container transfer device, it may be possible to use an appropriate transfer device other than the OHT. It may also be possible to use an OHS (Over Head Shuttle), an RGV (Rail Guided Vehicle), an AGV (Automated Guided Vehicle), and the like. The RGV and the AGV are container transfer devices that run on the floor side in a factory. When the container transfer device is the RGV, a rail (track) is installed on the floor of a factory or the like.

Further, the wafer transfer robot may have a traveling shaft capable of traveling in the width direction of the housing (parallel direction of the loading device). For example, when the number of rows of loading devices arranged side by side in the width direction of the housing is large, it is preferable to use a wafer transfer robot having a traveling axis extending in the width direction of the housing.

In the above-described embodiment, the nitrogen gas is taken as an example of the inert gas supplied to the inside of the housing. However, the present disclosure not limited thereto. It may be possible to use a dry gas, an argon gas, or the like. Similarly, the inert gas used for the bottom purging process is not limited to the nitrogen gas. Alternatively, the gas supplied to the inside of the housing does not necessarily have to be an inert gas, and may be, for example, dry air. According to this, it is possible to realize a low-humidity environment which is not an environment having a low oxygen concentration.

Further, the container door (FOUP door) may be temporarily in an inclined posture (accompanied by an operation of drawing a partial arc-shaped trajectory) in the process of moving from the fully closed position to the fully open position.

If the wafer alignment process may be omitted, the cost can be reduced by adopting a configuration in which the wafer aligner is not provided in the wafer transfer space.

Further, the gas introduction device may be configured by using an appropriate device other than the mass flow controller (MFC) that controls the flow rate while measuring the mass flow rate of the fluid. Moreover, the gas exhaust device may be configured by using an appropriate device other than the automatic pressure controller (APC) that maintains the internal positive pressure according to the amount of exhaust gas. For example, it may be possible to adopt a configuration in which the inert gas is introduced by a return duct that constitutes a gas circulation path. If the inert gas is introduced by the return duct, a backflow may be generated in the housing when the flow rate is large. Therefore, by introducing the inert gas into the housing from a position higher than the fan filter unit, it is possible to cope with the problem of backflow. In addition, by introducing the inert gas into the housing from a position higher than the fan filter unit, the air pressure is locally increased at the position higher than the fan filter unit, whereby the laminar flow is not disturbed.

A gas circulation path does not necessarily have to be formed in the housing. That is, the wafer stocker may be configured so that the gas is not circulated and the gas supplied into the housing by the gas introduction device is entirely discharged by the exhaust device.

The number of wafers that can be accommodated per wafer cassette is, for example, 25, but it may also be possible to use a wafer cassette that can accommodate a number of wafers other than 25 in a multi-stage manner.

A chemical filter may be installed around the return duct and the blower. Further, the return duct may be installed on a side surface of the housing.

In the wafer stocker, the fan filter unit is configured to generate a down-flow as a laminar flow. However, the present disclosure is not limited thereto. The wafer stocker may be configured to generate a laminar flow flowing in the horizontal direction in, for example, the wafer transfer space and the wafer cassette transfer space.

As the loading device, it may be possible to use a dedicated loading device different from the load port used in an EFEM.

It may also be possible to use the wafer stocker according to the present disclosure as a sorter. In this case, it is preferable to install a wafer front/back reversing machine together with a wafer aligner in the wafer transfer space.

Figure 10:
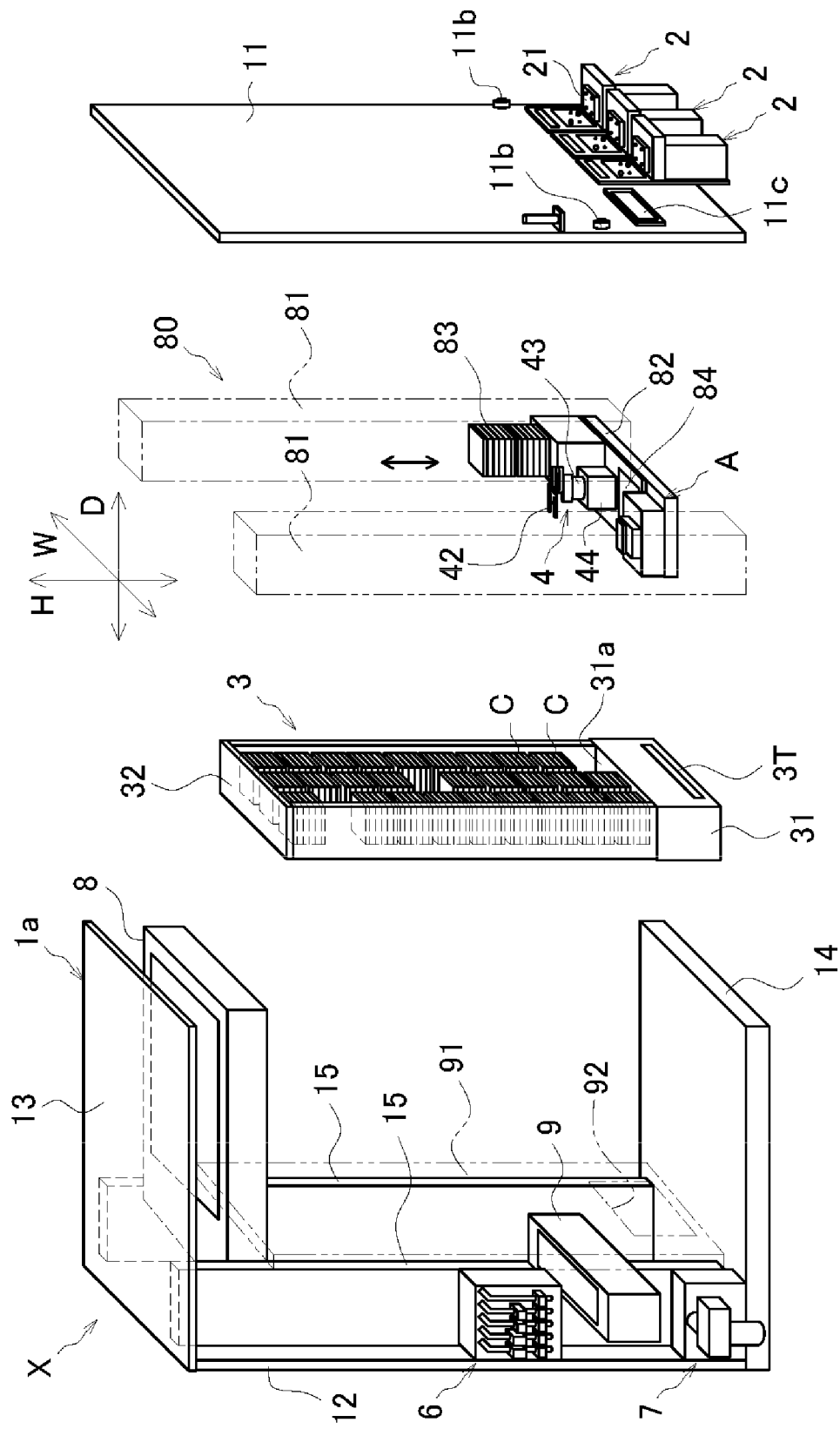
FIG. 10 is an exploded view of a wafer stocker according to a modification.

It may be possible to adopt a configuration in which the wafers are stored in the housing without having to use a wafer cassette, or a configuration in which the hands of the wafer transfer device hold and transfer a plurality of wafers at the same time. Further, by allowing the wafer transfer robot to be provided with a vertical movement mechanism, it may be possible for the wafer transfer robot to access each shelf and replace the wafers. Specifically, as shown in FIG. 10, the transfer system 1a may include a moving mechanism 80. For example, the moving mechanism 80 may include a pair of columnar members 81 erected on the front side and both left and right sides of the wafer cassette shelf 3, and a floor member 82 arranged substantially horizontally so as to be movable up and down along the columnar member 81 by a motor (not shown) or the like. The wafer transfer robot 4, the wafer aligner A, and a buffer stocker 83 capable of temporarily storing a plurality of wafers may be arranged on the floor member 82. The wafer transfer robot 4 may move the wafer between the FOUP 10 and the buffer stocker 83, and further move the wafer between the buffer stocker 83 and the wafer cassette shelf 3. The transfer system 1a may not include the wafer cassette delivery device 5 (see FIG. 2), and instead may include a vertical plate 91 formed with a passage 92 through which gas can pass. A fan filter unit 84 that generates a down-flow (laminar flow) may be attached to the floor member 82. As a result, for example, it is possible to suppress the scattering of the dust generated as the floor member 82 moves up and down.

Further, as a further modification of the transfer system 1a, as shown in FIG. 11, in a transfer system 1b, the wafer transfer robot 4, the moving mechanism 80 and the like may be additionally installed on the rear side of the wafer cassette shelf 3.

In addition, the specific configuration of each part is not limited to the above embodiments, and various modifications may be made without departing from the scope of the present disclosure.

EXPLANATION OF REFERENCE NUMERALS

1: housing, 2: loading device, 3: wafer cassette shelf, 4: wafer transfer robot, 4S: wafer transfer chamber (wafer transfer space), 5: wafer cassette delivery device, 5S: wafer cassette transfer chamber (wafer cassette transfer space), 8: fan filter unit, 10: FOUP (transfer container), X: wafer stocker

What is claimed is:

1. A wafer stocker, comprising:
    a housing including a front wall and a back wall;
    a loading device installed on a front surface of the housing and configured to mount a transfer container capable of accommodating a plurality of wafers;
    a wafer cassette shelf arranged in the housing and configured to store a plurality of wafer cassettes in a multi-stage manner, the plurality of wafer cassettes configured to store the plurality of wafers in a multi-stage manner;
    a wafer transfer robot configured to load and unload the wafers between the transfer container mounted on the loading device and the wafer cassettes stored in the wafer cassette shelf;
    a wafer cassette delivery device configured to move a wafer cassette stored in a predetermined stage among a plurality of stages of the wafer cassette shelf to a stage having at least a height different from the predetermined stage;
    a fan filter unit installed in the housing and configured to generate a laminar flow in a wafer transfer space of the housing in which the wafer transfer robot is arranged and in a wafer cassette transfer space of the housing in which the wafer cassette delivery device is arranged;
    a gas introduction pipe that extends horizontally along and under a ceiling wall of the housing in an internal space of the housing above the fan filter unit and has a plurality of holes that are formed along an extending direction of the gas introduction pipe and configured to supply gas to the fan filter unit;
    a return space installed in the housing between the back wall and the wafer cassette delivery device; and
    a blower installed in the return space and configured to generate a rising air flow that flows in the return space toward the fan filter unit,
    wherein a circulation path for circulating gas is formed in the housing, the circulation path including the wafer transfer space, the wafer cassette transfer space, and the return space.

2. The wafer stocker of claim 1, wherein the wafer transfer robot is configured to deliver the wafers between the transfer container mounted on the loading device and the wafer cassette arranged in a stage having a height facing the transfer container in a front-rear direction among the plurality of stages of the wafer cassette shelf.

3. The wafer stocker of claim 1, further comprising a wafer aligner installed in the wafer transfer space,
    wherein the wafers are loaded and unloaded between the transfer container and the wafer cassettes via the wafer aligner.

4. The wafer stocker of claim 1, wherein the wafer transfer robot includes an exhaust box configured to collect dust generated from the wafer transfer robot and connected to an exhaust device, and
    wherein the exhaust device is configured to discharge the dust collected in the exhaust box to an outside of the housing.

5. A wafer stocker, comprising:
    a housing including a front wall where a housing window is formed and a back wall;
    a loading device installed on a front surface of the front wall, having an opening formed to communicate with the housing window and configured to mount a transfer container to adjoin the transfer container to the opening, the transfer container being capable of accommodating a plurality of wafers;
    a wafer cassette shelf arranged in the housing and configured to store a plurality of wafer cassettes in a multi-stage manner, the plurality of wafer cassettes configured to store the plurality of wafers in a multi-stage manner;
    a wafer transfer robot configured to load and unload the wafers between the transfer container mounted on the loading device and the wafer cassettes stored in the wafer cassette shelf through the housing window;
    a wafer cassette delivery device configured to move a wafer cassette stored in a predetermined stage among a plurality of stages of the wafer cassette shelf to a stage having at least a height different from the predetermined stage;
    a fan filter unit configured to generate a laminar flow in a wafer transfer space of the housing in which the wafer transfer robot is arranged and in a wafer cassette transfer space of the housing in which the wafer cassette delivery device is arranged;
    a gas introduction pipe that extends horizontally along and under a ceiling wall of the housing in an internal space of the housing above the fan filter unit and has a plurality of holes that are formed along an extending direction of the gas introduction pipe and configured to supply gas to the fan filter unit;
    a return space installed in the housing between the back wall and the wafer cassette delivery device; and
    a blower installed in the return space and configured to generate a rising air flow that flows in the return space toward the fan filter unit,
    wherein a circulation path for circulating gas is formed in the housing, the circulation path including the wafer transfer space, the wafer cassette transfer space, and the return space.

6. The wafer stocker of claim 5, further comprising a wafer aligner installed in the wafer transfer space,
    wherein the wafers are loaded and unloaded between the transfer container and the wafer cassettes via the wafer aligner.

7. The wafer stocker of claim 5, wherein the wafer transfer robot includes an exhaust box configured to collect dust generated from the wafer transfer robot and connected to an exhaust device, and
    wherein the exhaust device is configured to discharge the dust collected in the exhaust box to an outside of the housing.

8. The wafer stocker of claim 5, wherein the wafer transfer robot is configured to deliver the wafers between the transfer container mounted on the loading device and the wafer cassette arranged in a stage having a height facing the transfer container in a front-rear direction among the plurality of stages of the wafer cassette shelf.

* * * * *